United States Patent [19]
Toro-Lira

[11] Patent Number: 6,000,905
[45] Date of Patent: Dec. 14, 1999

[54] HIGH SPEED IN-VACUUM FLAT PANEL DISPLAY HANDLER

[76] Inventor: Guillermo L. Toro-Lira, 1180 Reed Ave., Apt. 58, Sunnyvale, Calif. 94086

[21] Appl. No.: 09/041,635

[22] Filed: Mar. 13, 1998

[51] Int. Cl.[6] .................................................. H01J 37/18
[52] U.S. Cl. ...................... 414/805; 414/217; 414/221; 414/939
[58] Field of Search ..................... 414/217, 221, 414/939, 805

[56] References Cited

U.S. PATENT DOCUMENTS

| | | | |
|---|---|---|---|
| 4,355,937 | 10/1982 | Mack et al. | 414/217 |
| 4,405,435 | 9/1983 | Tateishi et al. | 414/217 X |
| 4,433,951 | 2/1984 | Koch et al. | 414/217 |
| 4,643,629 | 2/1987 | Takahashi et al. | 414/217 X |
| 4,824,309 | 4/1989 | Kakehi et al. | 414/217 |
| 4,990,047 | 2/1991 | Wagner et al. | 414/217 |
| 5,092,728 | 3/1992 | Crabb et al. | 414/217 |
| 5,098,245 | 3/1992 | Toro-Lira et al. | 414/217 |
| 5,121,705 | 6/1992 | Sugino | 414/217 X |
| 5,223,001 | 6/1993 | Saeki | 414/217 X |
| 5,273,423 | 12/1993 | Shiraiwa | 414/939 X |
| 5,308,989 | 5/1994 | Brubaker | 414/939 X |
| 5,378,283 | 1/1995 | Ushikawa | 414/217 X |
| 5,462,397 | 10/1995 | Iwabuchi | 414/217 X |
| 5,655,277 | 8/1997 | Galdos et al. | 414/217 X |
| 5,788,447 | 8/1998 | Yonemitsu et al. | 414/217 |
| 5,851,296 | 12/1998 | Haraguchi et al. | 414/217 X |

FOREIGN PATENT DOCUMENTS

| | | | |
|---|---|---|---|
| 406314731 | 11/1994 | Japan | 414/939 |
| 2 171 119 | 8/1986 | United Kingdom | 414/217 |

*Primary Examiner*—Robert P. Olszewski
*Assistant Examiner*—Gerald O'Connor
*Attorney, Agent, or Firm*—Burns, Doane, Swecker & Mathis, L.L.P.

[57] ABSTRACT

Transport of a workpiece into and out of high vacuum conditions is achieved using a vacuum handler having an ante-chamber which buffers a vacuum lock and other mechanically vulnerable components from high pressure differences. During loading of the workpiece, the ante-chamber is vented to atmospheric pressure while the vacuum lock door is sealed closed. The antechamber is then opened and receives the incoming workpiece from the exterior of the vacuum handler. The ante-chamber is then closed and evacuated to the pressure level of the vacuum lock, which is only opened once this pressure level is achieved. The vacuum lock receives the workpiece and is evacuated to the pressure of the main vacuum chamber of the vacuum handler and then opened thereto. An elevator assembly transports the workpiece into the vacuum chamber for processing. The process is reversed during unloading of the workpiece from the vacuum handler following processing completion.

20 Claims, 2 Drawing Sheets

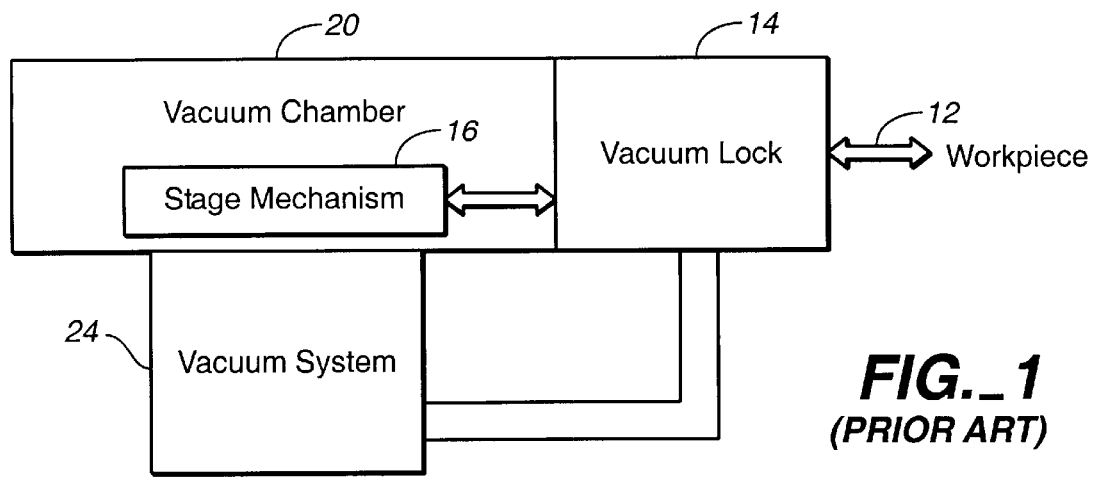
FIG._1
(PRIOR ART)
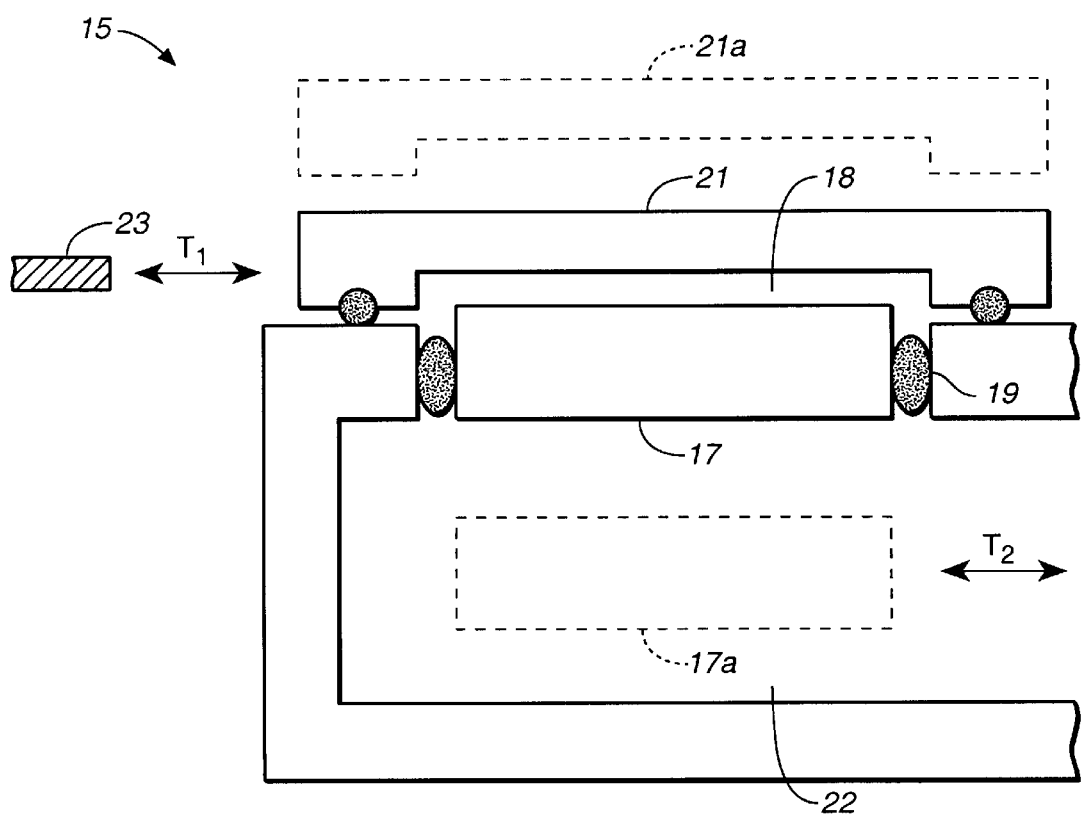
FIG._2
(PRIOR ART)

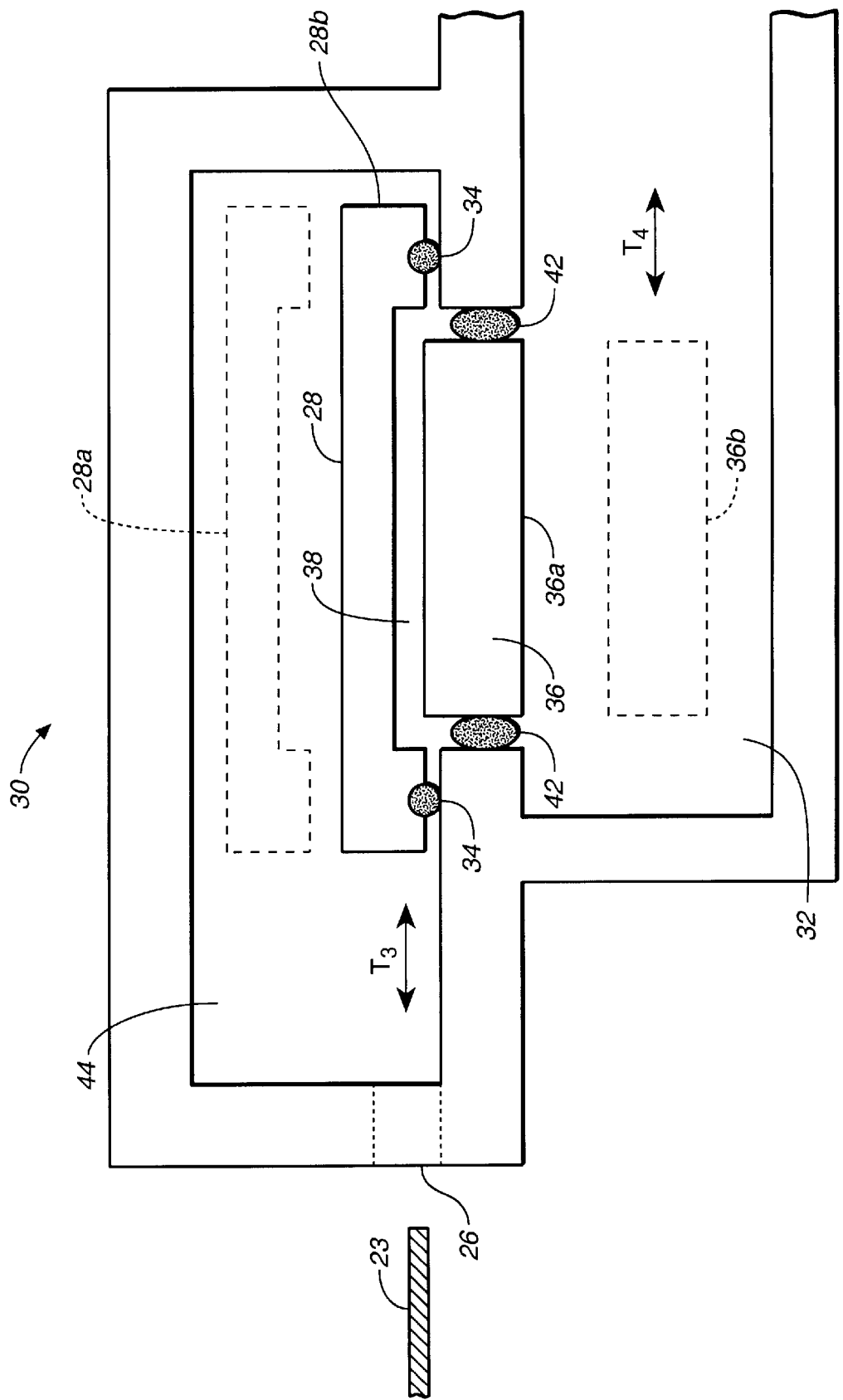
FIG._3

HIGH SPEED IN-VACUUM FLAT PANEL DISPLAY HANDLER

BACKGROUND OF THE INVENTION

1. Field of the Invention

The invention relates to flat panel display handling devices and, more particularly, to a system for transferring a flat panel display between normal atmospheric conditions and vacuum conditions.

2. Description of Related Art

The manufacturing of flat panel displays (FPDs) involves numerous complicated and specialized steps. Many of these steps must be performed in vacuum conditions. An example is the requirement of vacuum conditions for voltage contrast, or E-beam inspection methods which determine the integrity of a manufactured FPD pixel array and locate and identify defects therein. E-beam testing requires directing a beam of electrons in a vacuum at the substrate under inspection, and measuring secondary electron emission from the substrate. The voltage characteristics of the secondary electron emission signal is indicative of the electrical integrity of the substrate and can be used to locate and identify defects in the switching thin-film transistor (TFT) array of the FPD. Other applications of vacuum conditions during FPD manufacture are etching or deposition of materials.

Some of the FPD manufacturing steps are similar to those followed during, for example, semiconductor wafer manufacturing. In some situations, similar handling equipment can be used during manufacture and inspection of either the flat panel displays or the semiconductor wafers. However, new technology has enabled greater physical size of FPDs, and new constraints peculiar to FPD handling equipment have emerged. As a result, equipment which would have been adequate otherwise for use in both the FPD and the semiconductor manufacturing contexts with little modification has thus lost this versatility.

An example is vacuum handlers, which serve to transfer the workpiece between normal atmospheric conditions and vacuum conditions. FIG. 1 shows a vacuum handler of the prior art. During operation, vacuum chamber 20 is kept under high vacuum with a vacuum pumping system 24. A workpiece 12 is introduced first into a vacuum lock 14 without disruption of the vacuum integrity of the chamber 20. Then, using the same vacuum system 24 or a dedicated system (not shown), the vacuum lock 14 is evacuated until its pressure is about the same as that of vacuum chamber 20. Vacuum lock 14 is then opened into the chamber 20 and the workpiece 12 is transferred from the vacuum lock 14 onto a stage 16 or a similar work mechanism disposed within vacuum chamber 20. In this manner, a relatively high speed transfer of the workpiece 12 is effected since the volume of the vacuum lock 14 is typically much smaller than that of the vacuum chamber, requiring less time to evacuate.

U.S. Pat. No. 5,098,245 to Toro-Lira et al. and assigned to U.S. Phillips Corporation, is directed to a system for the handling of semi-conductor wafers and their transport into and out of a vacuum chamber. As is shown in FIG. 2 schematically illustrating the operation of the Toro-Lira system, a vacuum handler 15 is provided with a main vacuum chamber 22 and a vacuum lock 18. Vacuum lock 18 is sealed from the atmosphere by a circular outer door 21 shown in the closed position (21) and in an open position (21a). A circular elevator assembly 17 seals the vacuum lock 18 from the main vacuum chamber 22 using an inflatable seal 19 when the elevator assembly 17 is in the up position (solid lines). The seal 19 is shown in the inflated, or pressurized position. The sealing occurs in the cross-section opening of the main vacuum chamber 22. When the seal 19 is deflated, the elevator assembly 17 can be moved to the down position (17a) illustrated in phantom.

Operation of vacuum handler 15 is as follows: When the elevator assembly 17 is in the up position and the inflatable seal 19 pressurized, the vacuum lock 18 is vented to atmospheric conditions and outer door 21 lifted to the open position (21a). An external mechanism (not shown) transfers (arrow $T_1$) the semiconductor wafer 23 to the top of the elevator assembly 17 in the vacuum lock 18 region. Once the wafer is inserted in vacuum lock 18, the outer door 21 is moved to the closed position and the vacuum lock 18 evacuated.

When a sufficiently low pressure is achieved in vacuum lock 18, inflatable seal 19 is deflated and the elevator assembly 17 is moved to the down position (17a), carrying with it wafer 23 into the main vacuum chamber 22. At this point, an internal mechanism (not shown) transfers (arrow $T_2$) the wafer 23 into a vacuum chamber stage (not shown) and processing in the vacuum conditions commences. The reverse of the above procedure is subsequently followed when the processing is completed to thereby return the wafer 23 to the exterior 8 the vacuum handler 15.

The above system provides the advantage of a very fast wafer insertion process due to the relatively low volume of the vacuum lock 18 as compared with that of the main vacuum chamber 22, and dimensionally, the system is well suited for semi-conductor wafer handling. However, the advent of ever-larger flat panel displays has made applications of the conventional vacuum handlers an increasingly difficult task in FPD manufacture. Accommodation of large area FPDs by the vacuum handlers of the prior art is complicated because of the great forces developed by the high pressure differences involved, which present physical barriers taxing the limits of available materials and technology.

The limitations become evident when actual numbers are calculated and examined for the systems of the prior art. For example, in the configuration of FIG. 2, atmospheric pressure subjects the elevator assembly 17 to a very high vertical force when the outer door is in the open position (21a). For relatively small workpieces such as a 300 mm semiconductor wafer having an area of 0.0707 $m^2$, a mechanical implementation of the elevator assembly 17 which properly counteracts the atmospheric pressure is possible. However, for larger samples such as a 1100×1100 mm FPD substrate, the atmospheric pressure force that needs to be compensated for is approximately 27,560 lbs., or 12 tons. A practical prior art implementation of an elevator assembly mechanism which can sustain such a high vertical force in the requisite fast and reliable manner is not possible without introducing prohibitively high costs to the system. A need therefore exists to develop a vacuum handler that can withstand the high pressures attendant to the transport of workpieces between atmospheric and vacuum conditions in a fast, reliable and economical fashion.

SUMMARY OF THE INVENTION

The present invention relates to flat panel display handling devices and, more particularly, to a system for transferring a flat panel display between normal atmospheric conditions in vacuum conditions. In particular, the flat panel handling device of the present invention involves an antechamber in a vacuum handler to interface the main vacuum chamber of the vacuum handler with the atmosphere. In this handling device, vital components of the vacuum handler can be effectively shielded from the high pressure differences to which they would otherwise be subjected. The ante-chamber surrounds the vulnerable components of the vacuum handler, which are, namely, the vacuum lock and the elevator assembly and the seals associated therewith. These are then protected from the stressful pressure differences experienced during transport of a workpiece between atmospheric and vacuum conditions.

A vacuum handler in accordance with the present invention comprises a main vacuum chamber which is in communication with a vacuum lock via an elevator assembly. The vacuum lock is disposed in an ante-chamber which can be opened to provide access thereto from the exterior of the vacuum handler.

In operation, the ante-chamber is vented to atmospheric pressure or higher and then opened to allow placement of the workpiece therein. The ante-chamber is then sealed and evacuated. When a manageable pressure difference between the pressure level in the ante-chamber and that in the main vacuum chamber is reached, the vacuum lock is opened to the ante-chamber, and the workpiece placed therein. The vacuum lock is then closed and evacuated to a pressure in the vicinity of the pressure in the main vacuum chamber. This may be effected by deflating a seal of the elevator assembly to thereby equalize pressure between the vacuum lock and the vacuum chamber proper. When the pressure is thus equalized, the elevator assembly is lowered to thereby transfer the workpiece into the vacuum chamber for handling within the vacuum handler. The procedure is reversed to release the workpiece back into the atmosphere.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein:

FIG. 1 is a schematic diagram of a first prior art vacuum handler device;

FIG. 2 is a schematic diagram of a second prior art vacuum handler device; and

FIG. 3 is a schematic diagram of a vacuum handler device in accordance with the present invention.

DESCRIPTION OF THE PREFERRED EMBODIMENTS

FIG. 3 shows a vacuum handler 30 used to provide vacuum conditions for workpiece manufacturing operations. More specifically, the vacuum handler 30 comprises a main vacuum chamber 32 which is accessed from the outside through a vacuum lock 38 and an ante-chamber 44. The workpiece 13 is transferred through these regions of the vacuum handler 30 before reaching the main vacuum chamber 32 for processing under vacuum conditions, and is transferred through them to the exterior of the vacuum handler 30 when processing is complete.

Operation of the arrangement of FIG. 3 is as follows: With main vacuum chamber 32 under operating vacuum conditions and outer door 28 of vacuum lock 38 in the closed position (28b), ante-chamber 44 is vented to atmospheric pressure. Workpiece 13, initially disposed outside the vacuum handler 30, is then transferred to the interior of ante-chamber 44 through a suitable gate valve 26 (indicated by broken lines) provided in ante-chamber 44. The transfer is implemented using, for instance, a mechanical robotic arm 41 which is disposed inside the ante-chamber 44 and is retracted to within the confines of the ante-chamber 44 to permit the closing of gate 26. It is to be understood that the gate valve 26 must be adapted to maintain a vacuum seal when closed, and the art is replete with possible configurations which may readily be used for this purpose.

Following the transfer of workpiece 13 into ante-chamber 44 gate valve 26 is sealed. It should be noted that in order to minimize entry of contaminants from the atmosphere into the handler 30 and specifically into ante-chamber 44, the ante-chamber 44 may actually be pumped to a higher pressure than the atmosphere prior to the opening of gate valve 26 for loading the workpiece 13 into the ante-chamber 44. In this manner a pressure differential is established which will result in the efflux of gases from the ante-chamber 44 to the atmosphere and minimize the flow of atmospheric gases and contaminants in the reverse direction and into the vacuum handler 30 when gate valve 26 is opened for the loading and unloading processes. A preferable mode for establishing this requisite pressure differential utilizes nitrogen gas pumped into the ante-chamber 44. Those skilled in the art will appreciate that this expedient may be utilized in any of the below-described steps to control the flow direction of gases and reduce contamination during interfacing between the different stages of the vacuum handler 30.

After workpiece 13 is inside the ante-chamber 44 and the gate valve 26 sealed, ante-chamber 44 is evacuated. A suitable pressure to which this evacuation is achieved is on the order of 10 Torr, and this can be accomplished using for instance a mechanical roughing pump (not shown). Vacuum lock 38 is then opened by raising outer door 28 to the open position (28a). Since the pressure of the ante-chamber 44 is down to 10 Torr, opening vacuum lock 38 will not unduly stress elevator assembly 36, which stands as the only barrier between the extremely low pressure of main vacuum chamber 32 and workpiece 13. Thus in order to optimize operation, ante-chamber 44 pressure is reduced to the level permitted by the mechanical limitations of elevator assembly 36. The operator or designer of vacuum handler 30, in selecting the pressure to which ante-chamber 44 is to be brought, will take into account the mechanical limitations of the elevator assembly 36, and balance these limitations against the amount of time required to evacuate the ante-chamber 44 to thereby achieve optimum operation conditions and maximize system throughput.

Workpiece 13, now in ante-chamber 44, is then transferred to vacuum lock 38. Arrow $T_3$ indicates the transfer of the workpiece 13 between ante-chamber 44 and vacuum lock 38, which may be accomplished using mechanical robot arm 41.

Following transfer of the workpiece 13 into vacuum lock 38, outer door 28 is moved to the closed position (28b) and sealed by operation of seal 34 which hermetically seals the vacuum lock 38 from the ante-chamber 44. At this point vacuum lock 38 may be further evacuated in order to equalize the pressure therein with that in main vacuum chamber 32, or to at least bring the pressure therein to the vicinity of the pressure in main vacuum chamber 32 such that upon opening of vacuum lock 38 to main vacuum chamber 32 the resulting spike in pressure increase in main vacuum chamber 32 is minimized. Alternatively, evacuation of vacuum lock 38 prior to opening it to the main vacuum chamber may not be necessary, with inflatable seals 42 simply being deflated after outer door 28 is closed, although this is not a preferred embodiment because of the magnitude of the disruptive resultant pressure spike in the main vacuum chamber 32.

As implied above, it is contemplated that various relative pressure configurations, or stages, may be used between the ante-chamber 44, vacuum lock 38, and main vacuum chamber 32 without departure from the spirit and scope of the invention. Design constraints governing the particular configuration selected would be based on factors readily recognized by those skilled in the art and may be imposed by, for instance, the size of the workpiece and the various regions in the vacuum handler, along with the projected overall system cost and required throughput. Moreover, pressure control for ante-chamber 44, vacuum lock 38 and main vacuum chamber 32 may be implemented using dedicated equipment or using shared equipment appropriately controlled without inventive departure from the teachings of the invention. Specifically, while a combination of a mechanical roughing pump and either a cryogenic or turbo molecular pump may be required for the main vacuum chamber 32, whose operational pressure is ideally at 0 Torr (on the order of $10^{-7}$ Torr in actuality), the ante-chamber 44 and the vacuum lock 38 may only require the use of a mechanical roughing pump to evacuate. Thus the same mechanical roughing pump can be appropriately adapted for all three regions, with a cryogenic or turbo molecular pump added for use in the main vacuum chamber 32. Alternatively, each region can be provided with its own pumping system. Again cost and efficiency constraints will dictate the particular design chosen as those skilled in the art will appreciate.

To transport workpiece 13 from vacuum lock 38 to the main vacuum chamber 32, elevator assembly 36 is lowered from the up position (36a) to the down position (36b). This is preceded by first deflating inflatable seal 42. Use of other types of seals is also contemplated so long as they are capable of maintaining hermetical sealing between vacuum lock 38 and main vacuum chamber 32.

Lowering elevator assembly 36 to the down position (36b) places workpiece 13 in main vacuum chamber 32. As indicated by arrow $T_4$, the workpiece 13 is then transferred to a stage (not shown) disposed in the work region within main vacuum chamber 32 for ensuing vacuum condition processing, which commences preferably after elevator assembly 36 is restored to the up position (36a) and inflatable seal 42 re-inflated to preserve vacuum conditions in main vacuum chamber 32. This also minimizes the influx of contaminants into main vacuum chamber 32, a primary and constant source of which is water molecules adhering to the interior walls of ante-chamber 44. These water molecules originate in the atmosphere, making it particularly advantageous to minimize the length of time vacuum chamber 32 is directly or indirectly in communication with atmospheric gases. Hence gate valve 26 and outer door 28 should not be opened longer than necessary to transfer the workpiece 13 therethrough. Transport of workpiece 13 within the main vacuum chamber 32 may be effected using automatic robot arm 31.

At the completion of vacuum condition operations, such as E-beam testing and/or material etching or deposition, workpiece 13 is transferred out of vacuum handler 30. This is accomplished by effectively reversing the above procedures, with the workpiece 13 passing first from the main vacuum chamber 32 to vacuum lock 38 via elevator assembly 36, then from vacuum lock 38 to ante-chamber 44, then from the ante-chamber to the exterior of the vacuum handler 30. During this process the operational pressure sequence of the different regions of the vacuum handler 30 is similarly reversed.

Although discussed with a view for use in flat panel display (FPD) manufacture, it is to be understood that the invention can be used with any other substrates which require vacuum condition processing. Advantages of the invention include a graduated pressure change between the atmosphere and the main vacuum chamber 32, which permits a practical mechanical implementation of the elevator assembly. For example, assuming an FPD substrate size of 1100×1100 mm (1.21 $m^2$), the force applied to the elevator assembly 36 is reduced from the prior art figure of 27,560 lbs to only about 272 lbs with an ante-chamber at 7.5 Torr. The limits of conventional semiconductor vacuum handlers, designed to handle at most 300 mm diameter wafers (0.0707 $m^2$) can thus be readily surpassed. The evacuation of the ante-chamber to the low Torr regions is relatively simple and can be economically implemented using available technology.

The above are exemplary modes of carrying out the invention and are not intended to be limiting. It will be apparent to those skilled in the art that modifications thereto can be made without departure from the spirit and scope of the invention as set forth in the following claims.

What is claimed is:

1. A vacuum handler for processing a workpiece in vacuum conditions comprising:

a main vacuum chamber adapted for evacuation to a first predetermined operating pressure level below atmospheric pressure;

an ante-chamber adapted for evacuation to a second predetermined pressure level below atmospheric pressure and above the operating pressure level of the main vacuum chamber;

an elevator assembly for transporting the workpiece between the main vacuum chamber and the vacuum lock; and a vacuum lock in communication with the main vacuum chamber and the ante-chamber, the vacuum lock capable of being hermetically sealed from the main vacuum chamber and the ante-chamber and adapted for passage of the workpiece therethrough during transport of the workpiece between the ante-chamber and the main vacuum chamber, wherein the vacuum lock and ante-chamber operate to reduce atmospheric pressure force imparted to the elevator assembly by at least 90 percent.

2. The vacuum handler of claim 1, wherein the workpiece comprises a flat panel display (FPD) substrate.

3. The vacuum handler of claim 2, wherein the FPD substrate has an area in excess of 0.071 $m^2$.

4. The vacuum handler of claim 1, wherein the elevator assembly is adapted to translate between an up position and a down position, the main vacuum chamber and the vacuum lock being substantially hermetically sealed from each other in the up position.

5. The vacuum handler of claim 4, wherein a first inflatable seal is provided to establish the hermetical sealing between the main vacuum chamber and the vacuum lock when the elevator assembly is in the up position.

6. The vacuum handler of claim 5, further comprising a vacuum lock outer door adapted to translate between an open position and a closed position, the vacuum lock adapted for evacuation to a third predetermined intermediate pressure level when the outer door is in the closed position, the intermediate pressure level being lower than the second predetermined pressure level and higher than the first predetermined operating pressure level.

7. The vacuum handler of claim 6, further comprising a second seal for substantially hermetically sealing the vacuum lock from the ante-chamber when the outer door is in the closed position.

8. The vacuum handler of claim 7, further comprising a gate valve for loading the workpiece into the ante-chamber and for unloading the workpiece from the ante-chamber.

9. The vacuum handler of claim 8, further comprising a first robotic arm disposed inside the ante-chamber and adapted to transport the workpiece between the ante-chamber and the vacuum lock and a second robotic arm disposed inside the main vacuum chamber and adapted to transport the workpiece between the elevator assembly and a work region in the main vacuum chamber.

10. A method for transporting a workpiece between atmospheric conditions at the exterior of a vacuum handler and vacuum conditions at a main vacuum chamber in the interior of the vacuum handler, the method comprising:

evacuating the main vacuum chamber to a first predetermined operating pressure level;

evacuating a vacuum lock region of the vacuum handler to a second predetermined pressure level higher than the operating pressure level;

evacuating an ante-chamber region in the vacuum handler to a third predetermined pressure level higher than the second predetermined pressure level; and transporting the workpiece successively between the ante-chamber region, the vacuum lock region and the main vacuum chamber using an elevator assembly, wherein the vacuum lock region and the ante-chamber serve to achieve an at least 90 percent reduction in atmospheric pressure force imparted to by the elevator assembly.

11. The method of claim 10, further comprising the steps of:

establishing in the ante-chamber a fourth predetermined pressure level; and transferring the workpiece from the exterior of the vacuum handler into the ante-chamber.

12. The method of claim 11, wherein the step of establishing comprises pumping nitrogen gas into the ante-chamber.

13. The method of claim 12, wherein the fourth predetermined pressure level is atmospheric pressure.

14. The method of claim 12, wherein the fourth predetermined pressure level exceeds atmospheric pressure.

15. The method of claim 10, wherein the step of transporting comprises:

equalizing the pressures in the ante-chamber region and the vacuum lock region;

transporting the workpiece from the ante-chamber region to the vacuum lock region;

equalizing the pressures in the vacuum lock region and the main vacuum chamber; and transporting the workpiece from the vacuum lock region to the main vacuum chamber.

16. The method of claim 15, wherein the step of equalizing the pressures in the ante-chamber region and the vacuum lock region comprises:

hermetically sealing the vacuum lock region from the main vacuum chamber; and venting the vacuum lock region to the third predetermined pressure level.

17. The method of claim 15, wherein the step of equalizing the pressures in the vacuum lock region and the main vacuum chamber comprises:

hermetically sealing the vacuum lock region from the ante-chamber region; and evacuating the vacuum lock region to the first predetermined operating pressure level.

18. The method of claim 10, wherein the steps of evacuating are effected using at least one mechanical roughing pump.

19. The method of claim 10, wherein the step of evacuating the main vacuum chamber is effected using a cryogenic pump in combination with a mechanical roughing pump.

20. The method of claim 10, wherein the step of evacuating the main vacuum chamber is effected using a turbo molecular pump in combination with a mechanical roughing pump.

* * * * *